(12) United States Patent
Di Stefano

(10) Patent No.: US 8,033,877 B2
(45) Date of Patent: Oct. 11, 2011

(54) CONNECTOR FOR MICROELECTRONIC DEVICES

(75) Inventor: Thomas H. Di Stefano, Monte Sereno, CA (US)

(73) Assignee: Centipede Systems, Inc., San Jose, CA (US)

( * ) Notice: Subject to any disclaimer, the term of this patent is extended or adjusted under 35 U.S.C. 154(b) by 0 days.

(21) Appl. No.: 12/506,974

(22) Filed: Jul. 21, 2009

(65) Prior Publication Data

US 2010/0022105 A1    Jan. 28, 2010

Related U.S. Application Data

(60) Provisional application No. 61/082,788, filed on Jul. 22, 2008, provisional application No. 61/082,794, filed on Jul. 22, 2008, provisional application No. 61/082,796, filed on Jul. 22, 2008, provisional application No. 61/082,798, filed on Jul. 22, 2008.

(51) Int. Cl.
*H01R 11/22* (2006.01)

(52) U.S. Cl. ...................................... 439/851
(58) Field of Classification Search ............ 439/70, 439/853, 851, 848, 8
See application file for complete search history.

(56) References Cited

U.S. PATENT DOCUMENTS

| | | | |
|---|---|---|---|
| 2,453,172 A * | 11/1948 | Wilkie | 439/848 |
| 3,493,917 A * | 2/1970 | Glowacz | 439/268 |
| 3,676,838 A | 7/1972 | Hartz et al. | |
| 5,135,403 A | 8/1992 | Rinaldi | |
| 5,295,862 A | 3/1994 | Mosquera | |
| 5,554,048 A | 9/1996 | Martins | |
| 5,634,829 A * | 6/1997 | Kerul | 439/851 |
| 5,669,774 A | 9/1997 | Grabbe | |
| D387,729 S | 12/1997 | Huska | |
| 5,730,606 A * | 3/1998 | Sinclair | 439/70 |
| 5,887,344 A | 3/1999 | Sinclair | |
| 5,984,694 A | 11/1999 | Sinclair | |
| 6,007,349 A | 12/1999 | Distefano et al. | |
| 6,159,056 A | 12/2000 | Boyle | |
| 6,264,476 B1 | 7/2001 | Li et al. | |
| 6,374,487 B1 | 4/2002 | Haba | |
| 6,471,525 B1 | 10/2002 | Fan et al. | |
| 6,720,511 B2 | 4/2004 | Windebank | |
| 7,029,292 B2 | 4/2006 | Grabbe | |
| 7,393,214 B2 | 7/2008 | DiStefano | |
| 7,445,001 B2 | 11/2008 | Sikora | |
| 2003/0068916 A1 | 4/2003 | Ju | |
| 2004/0106237 A1 | 6/2004 | Yamazaki | |

FOREIGN PATENT DOCUMENTS

JP        UB08203644 A2    8/1996

* cited by examiner

*Primary Examiner* — Phuong Dinh
(74) *Attorney, Agent, or Firm* — Michael B. Einschlag

(57) ABSTRACT

One embodiment is a connector for making electrical connection to a bulbous terminal, the connector including: a metal tube with a cylindrical wall extending from a mating end, wherein: (a) two or more slots perforate the wall and extend from the mating end along the tube; (b) two or more apertures perforate the wall and are disposed in a circumferential array disposed a distance from the mating end; and (c) each of the two or more slots transects one of the two or more apertures to divide the mating end of the tube into resilient prongs.

9 Claims, 7 Drawing Sheets

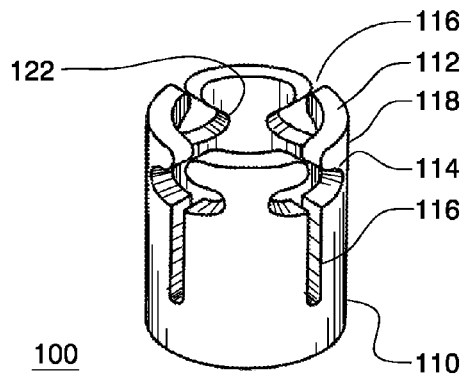
FIG. 1A
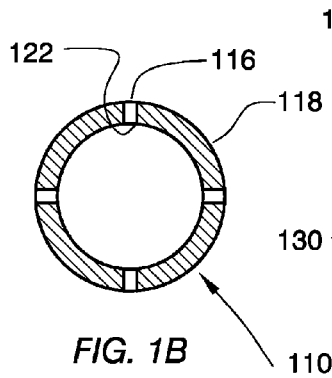
FIG. 1B
SECTION B-B'
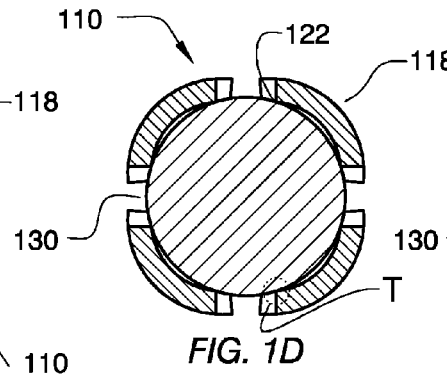
FIG. 1D
SECTION D-D'
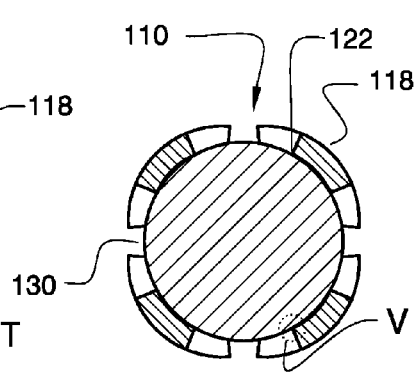
FIG. 1F
SECTION F-F'
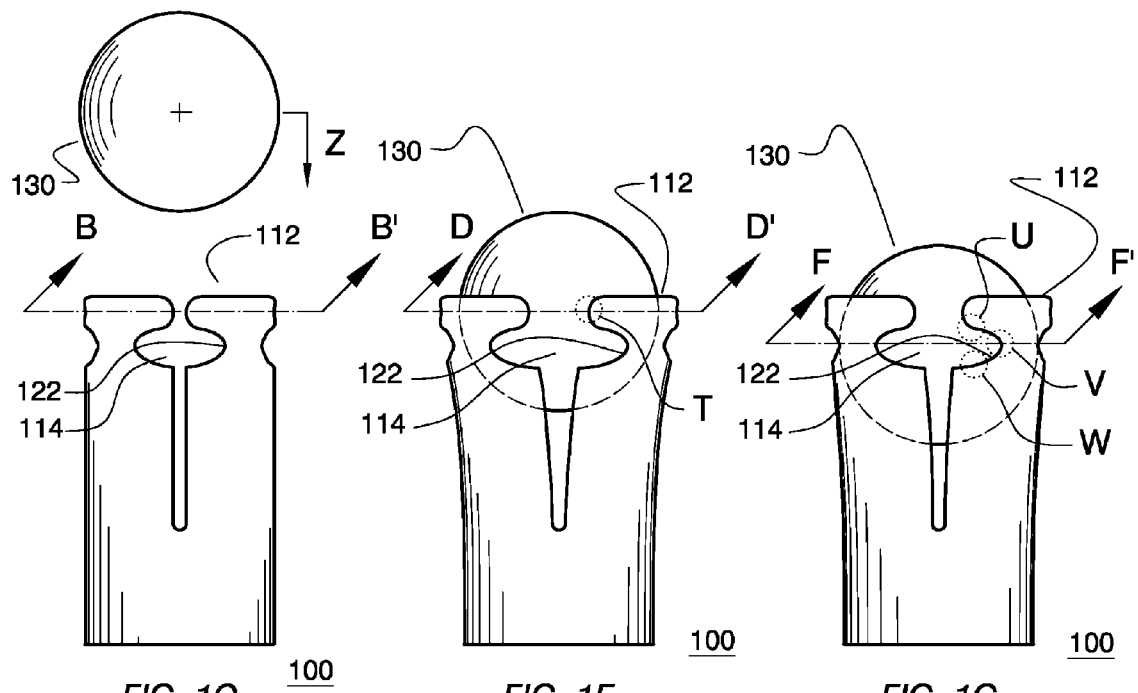
FIG. 1C
FIG. 1E
FIG. 1G

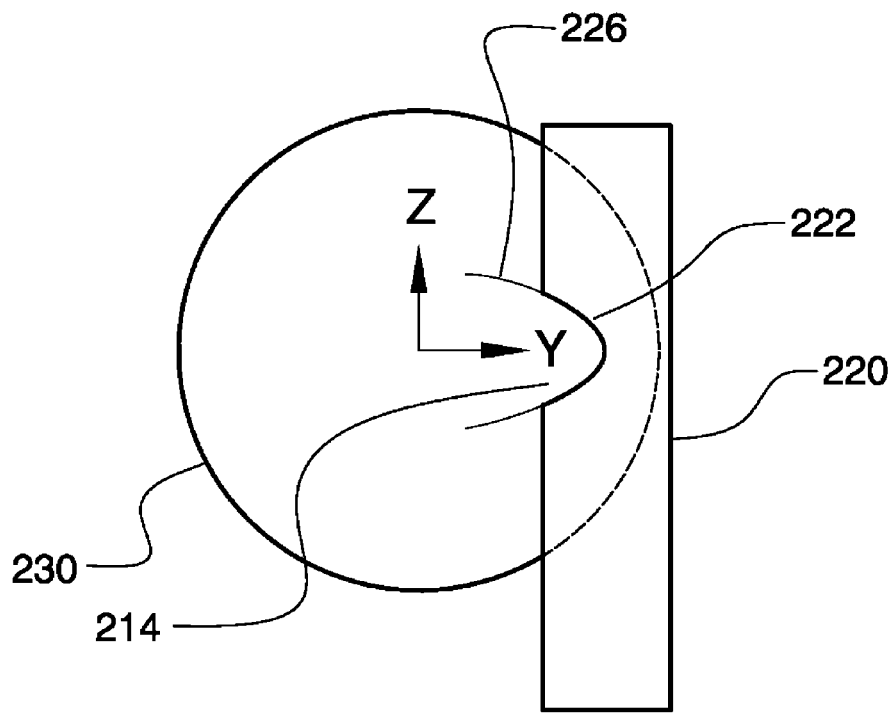
FIG. 3A    ELEVATION VIEW
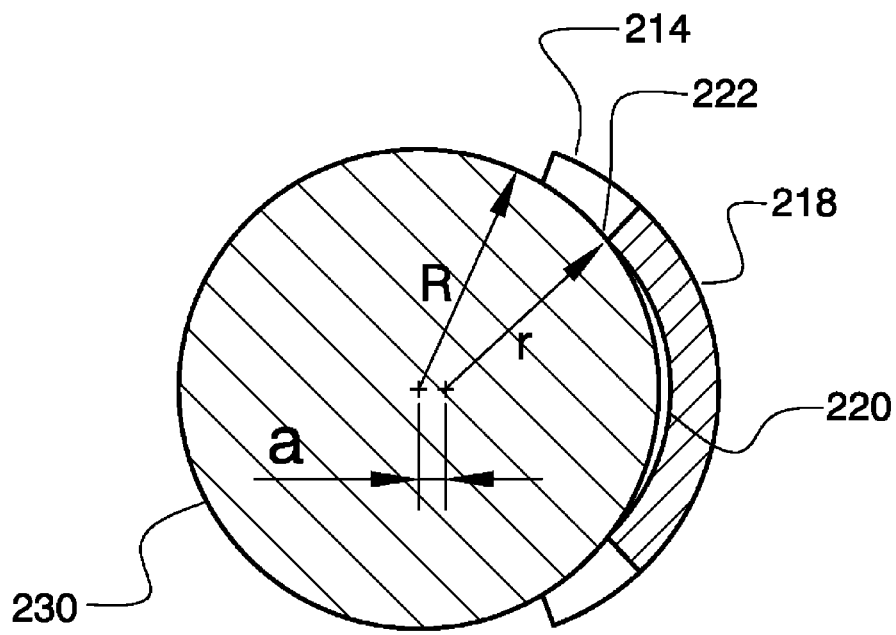
FIG. 3B    TOP SECTIONAL VIEW

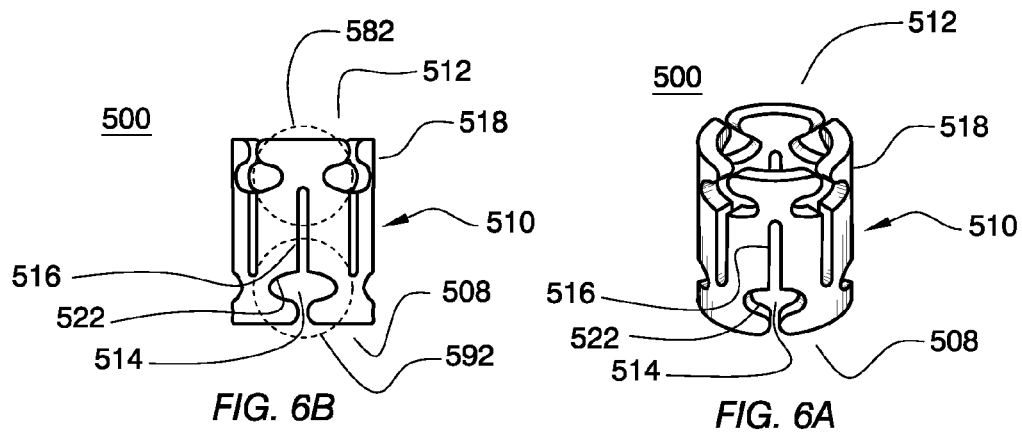
FIG. 6B
FIG. 6A
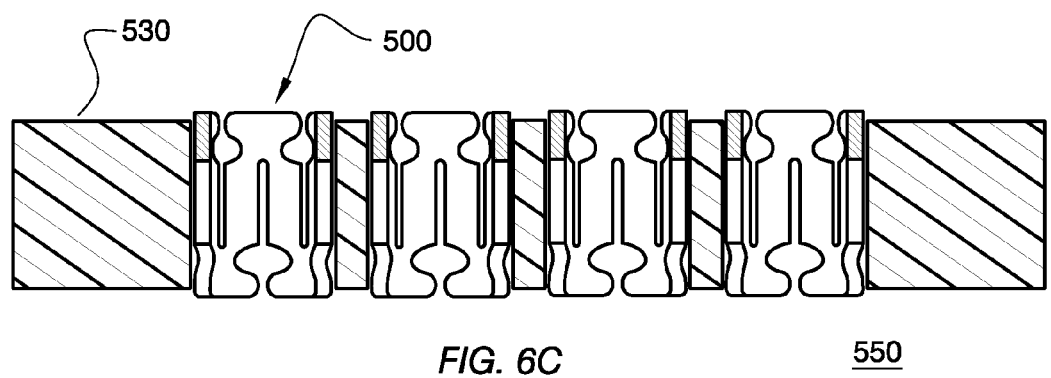
FIG. 6C
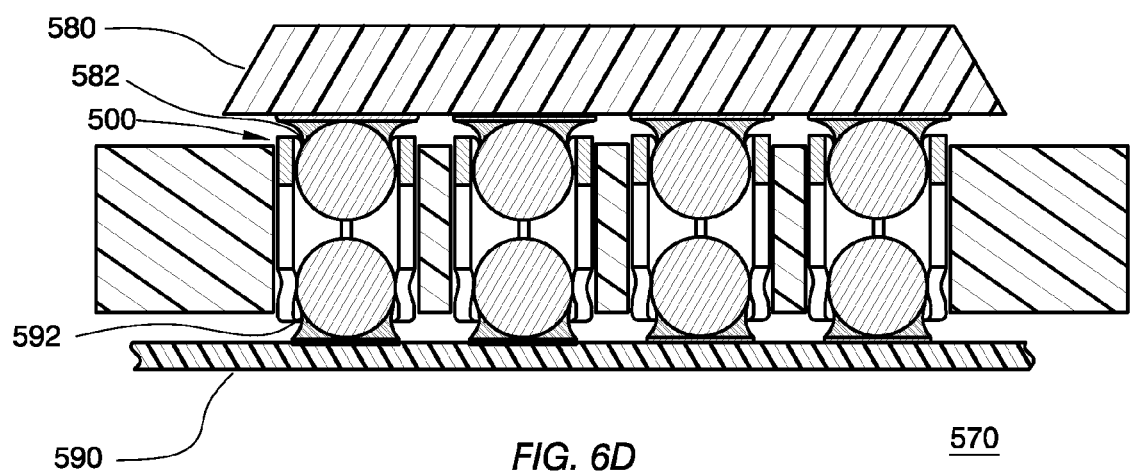
FIG. 6D

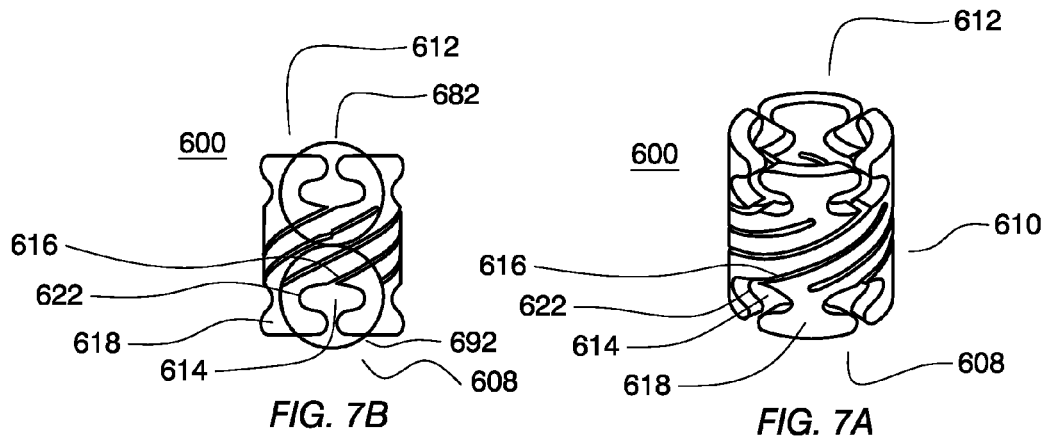
FIG. 7B
FIG. 7A
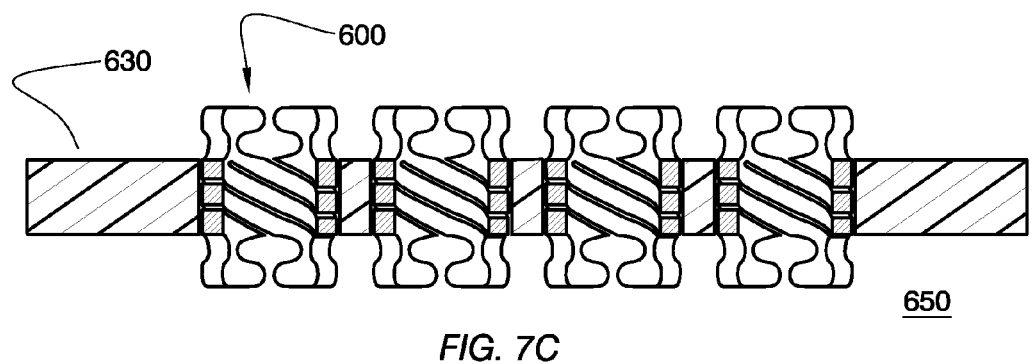
FIG. 7C
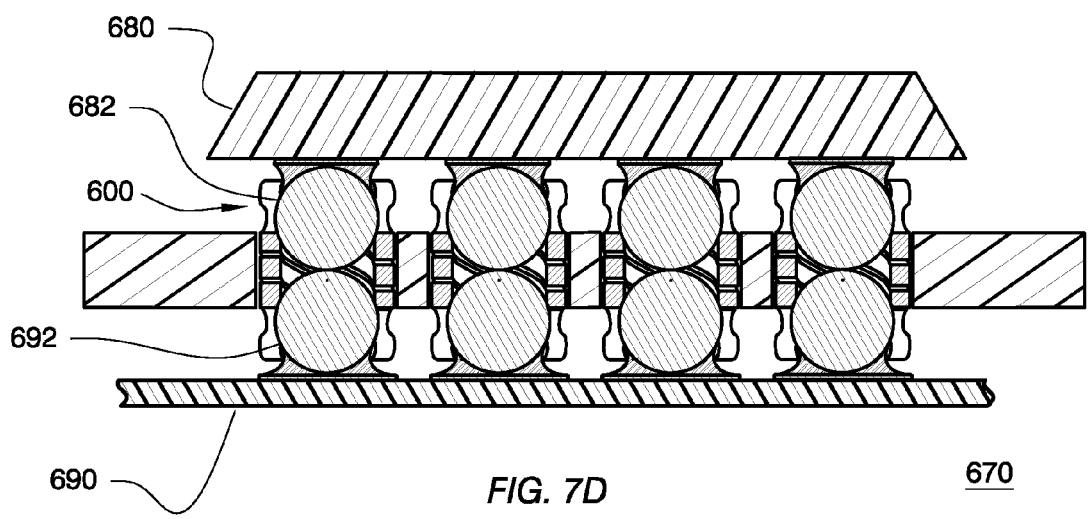
FIG. 7D

CONNECTOR FOR MICROELECTRONIC DEVICES

This patent application relates to U.S. Provisional Applications having Appl. Nos. 61/082,788, 61/082,794, 61/082,796, and 61/082,798—all filed Jul. 22, 2008, from each of which priority is claimed under 35 USC §119(e), and each of which provisional applications is incorporated herein in its entirety.

CROSS-REFERENCE TO RELATED APPLICATIONS

This application is related to: a U.S. Patent Application having application Ser. No. 11/670,340, filed Feb. 2, 2007; a U.S. Patent Application having application Ser. No. 12/246,267, a divisional of a U.S. Patent Application having application Ser. No. 11/893,979 filed Jul. 17, 2007; and U.S. Design Patent Applications having application Ser. Nos. 29/323,765, 29/323,773, 29/323,778, and 29,323/781, all filed Aug. 28, 2008—all of which applications are assigned to the assignee of this case.

TECHNICAL FIELD OF THE INVENTION

One or more embodiments of the present invention relate to electrical connectors for making connections to devices such as, for example and without limitation, microelectronic devices. More particularly, one or more embodiments of the present invention relate to miniature electrical connectors such as, for example and without limitation, ball grid array (BGA) connectors, adapted to making connections to microelectronic devices. Yet more particularly, one or more embodiments of the present invention relate to a high density electrical connector, i.e., a connector for supplying current to a large number of closely spaced terminals (relative to connectors of comparable size) and high frequency (RF) signals to high performance microelectronic devices such as, for example and without limitation, integrated circuits ("ICs")—including, also without limitation, microprocessors, chips for peripheral functions and random access memories (RAM).

BACKGROUND

Connectors are used widely in electronics to interconnect microelectronic devices such as semiconductor integrated circuits (ICs), printed wiring boards, system boards, backplanes, and cables of various sorts. A socket is a type of connector used to connect terminals on an electronic device to corresponding contacts on a printed circuit board or other electrical interconnection apparatus. Sockets are often arranged in an array of "female-type" elements that are intended to engage "male-type" elements of a terminal array. In addition, sockets are routinely used in systems for: (a) testing electronic device performance (an assortment of types of sockets has been developed to connect to a device under test ("DUT") having a wide variety of terminals and configurations); or (b) burn-in of electronic devices at elevated temperatures. A cable connector is typically used to connect an array of terminals on an electrical cable to a group of corresponding electrical terminals or other conductors. Backplane connectors and inter-board connectors are typically used to connect an array of terminals on one printed wiring board to a corresponding array of terminals on another printed wiring board.

Advances in the density and speed of electronic devices are placing additional demands on connectors. In particular, a continuing increase in the wiring density of electronic systems requires a corresponding advance in the density of connectors as determined by the number of contacts per unit area. Further, at higher frequencies and clock speeds, the size and the self inductance of connectors are becoming an important limitation to system performance. In addition to a lower inductance, advances in impedance control and shielding are required for future electronic systems.

Prior art connectors are differentiated typically according to contactor type and intended use (i.e., application). As such, connectors used in applications in sockets are typically specifically designed to make electrical contact to microelectronic devices having specific types of device terminals. For example, specific types of device terminals contacted by sockets include pin grid arrays ("PGAs"), J-leads, gull-wing leads, dual in-line ("DIP") leads, ball grid arrays ("BGAs"), column grid arrays ("CGAs"), flat metal pads, land grid arrays ("LGAs"), and many others. Many contactor technologies have been developed to provide sockets for microelectronic devices having this variety of terminals.

In addition to the foregoing, further differentiation among prior art sockets refers to low insertion force ("LIF") sockets, zero insertion force ("ZIF") sockets, auto-load sockets, burn-in sockets, high performance test sockets, and production sockets (i.e., sockets for use in products). In further addition to the foregoing, low cost prior art sockets for burn-in and product applications typically incorporate contactors of stamped and formed springs that are adapted to connect to terminals on a DUT. In still further addition to the foregoing, for high pin-count, prior art sockets, a cam is often used to urge device terminals laterally against corresponding contactors to make good contact to each terminal while allowing low or zero insertion force.

For specialized applications, prior art sockets have used a wide variety of contactors, including anisotropic conductive sheets, flat springs, lithographically formed springs, fuzz buttons (available from Cinch, Inc. of Lombard, Ill.), spring wires, barrel connectors, and spring forks, among others. Prior art sockets intended for applications where many test mating cycles (also referred to as socket mount-demount cycles) are required typically use spring pin contactors (also referred to as spring probes or spring contacts) of the type exemplified by Pogo® spring contacts (available from Everett Charles Technologies of Pomona, Calif.).

Spring probes for applications in the electronics test industry are available in many configurations, including simple pins and coaxially grounded pins. Most prior art spring probes consist of a helical wire spring disposed between a top post (for contacting terminals on a DUT) and a bottom post (for contacting contacts on a circuit board—a device under test board or "DUT board").

Prior art sockets typically have a plurality of contactors disposed in an array of apertures formed through a dielectric holder. By way of example, a high performance, prior art test socket may incorporate a plurality of Pogo® spring contacts, each of which is held in a pin holder with an array of holes through a thin dielectric plate. The dielectric material in a high performance, prior art test socket is typically selected from a group of dimensionally stable polymer materials including: glass reinforced Torlon 5530 available from Quadrant Engineering Plastic Products, Inc. of Reading, Pa.; Vespel; Ultem 2000 available from GE Company GE Plastics of Pittsfield, Mass.; PEEK; liquid crystal polymer; and others. Individual Pogo® spring contacts are typically selected and designed for signal conduction at an impedance level of approximately fifty (50) ohms. In certain high performance, prior art configurations, the contactor is a coaxial type contactor having a center spring pin with a contactor barrel body enclosed within a cylindrical, coaxial, ground shield spaced to achieve a desired signal impedance, typically fifty (50) ohms.

Connectors used in applications for connecting one printed wiring board to another printed wiring board can be classified by type, including edge connectors, pin-in-barrel connectors, stamped spring connectors, spring fork connectors, LAN-grid array connectors, conductive elastomeric connectors, and various other types known in the art.

Cable connectors adapted to flat cables are generally similar to printed wiring board to printed wiring board connectors with an added feature that one side of a connection is made to a flex cable or a flat array of wires rather than to a printed wiring board. Cable connectors adapted to a round bundle of wires are generally of the type employing a pin in barrel wherein a spring in the barrel retains the pin and applies a lateral force on the pin to establish reliable electrical contact. The spring incorporated into the barrel element may be a spring insert, a bundle of spring wires or an integral spring in the barrel.

The class of connectors used for socketing ICs is specialized and important in the electronics industry. The recent growth in use of BGA terminals for IC packaging has resulted in use of new and varied sockets adapted to BGA terminals for increasing terminal count and area density. BGA sockets have evolved in several directions. One type of BGA socket involves use of a cam driven spring wire to contact the side of each ball. In another type of BGA socket, spring pins or Pogo® pins have been adapted for use in such BGA sockets for certain applications in which the high cost of a socket is acceptable.

Low-cost BGA sockets for mass market applications have evolved the use of stamped and formed springs that cradle each ball of the BGA and provide some measure of mechanical compliance needed to urge a spring connector into contact with a mating ball. In such sockets, variations of stamped and formed springs are configured to use two or more formed springs to grip each ball, and thereby, to make positive electrical contact while retaining the ball mechanically. However, miniaturization and density of mechanically stamped and formed springs are limited to a certain size by present manufacturing capabilities. Although advances continue to be made in the manufacturing art of stamping and forming springs, sockets with contactors thusly made are limited in density by the complexity of stamping and forming very small miniaturized springs. Further, the mechanical compliance of a stamped and formed spring is typically small in a vertical direction, i.e., perpendicular to a substrate of a ball. Because of small compliance in the vertical direction, a miniature stamped and formed spring may be unable to accommodate motion of a contactor support relative to a ball mated to it, thereby allowing vibration, mechanical shock load and forces, flexure, and the like to cause the connector to slide over the surface of the ball. It is known in the industry that repeated microscopic motion of one contact relative to a mating contact causes fritting or a build up of small particle debris that can lead to contact failure.

Stamped and formed spring contacts are typically held in an array of shaped through holes in a molded plastic housing to form a connector assembly. As connector assemblies are miniaturized, the molding and assembly process become increasingly difficult and costly, thereby limiting the extension of connectors based on formed spring contacts to higher densities.

BGA sockets have also been constructed with contactors that make electrical contact to a bottom region of a ball by means of bundles of helical wires, wires in elastomeric material, cantilever springs, lithographically formed flat springs and other contactors that apply force vertically to a mating ball. The vertical force is necessary to make a good connection between a ball of a BGA and such force is significant for BGA packages with a large number of balls or bumps. For example, the clamping force for a BGA socket that applies force vertically to 1200 contact bumps is as high as 30 Kg to achieve adequate contact to each of the contact bumps. The clamping force needed by BGA sockets that make contact by applying force vertically is an increasing problem as the number of contact bumps increases into the thousands.

As is well known to those of ordinary skill in the art, a primary function of prior art connectors is to provide reliable and repeatable electrical contact to electrical terminals without causing damage to either. Further, a connector must provide a low resistance connection over a product lifetime that involves repeated temperature cycles, mechanical shock, vibration and flexure. As such, contact resistance is one measure of reliability of a connector as determined as a function of a number of temperature cycles, a number of drops, a number of flexures and a G-force level of vibration. As the size and spacing of terminals on microelectronic devices continue to be miniaturized, maintaining contact between the terminals and socket contactors is proving increasingly difficult. Sockets that rely upon frictional forces to retain the microelectronic device in the socket cannot easily be extended to terminal densities projected for the future. Improvements are needed in technology for contacting and retaining microelectronic devices in sockets and connectors of future electronic systems.

SUMMARY

In accordance with one or more embodiments of the present invention, a connector is provided for making electrical connection to bulbous terminals on microelectronic devices and for mechanically retaining the terminals in the mating connectors. In particular, one embodiment is a connector for making electrical connection to a bulbous terminal, the connector comprising: a metal tube with a cylindrical wall extending from a mating end, wherein: (a) two or more slots perforate the wall and extend from the mating end along the tube; (b) two or more apertures perforate the wall and are disposed in a circumferential array disposed a distance from the mating end; and (c) each of the two or more slots transects one of the two or more apertures to divide the mating end of the tube into resilient prongs.

BRIEF DESCRIPTION OF THE DRAWINGS

FIG. 1A is a perspective sectional view of a single ended, tubular connector having prongs adapted to retaining a bulbous terminal post having a maximum diameter slightly larger than an inner diameter of the tubular connector, which connector is fabricated in accordance with one or more embodiments of the present invention.

FIGS. 1B and 1C are top cross-sectional and elevation views, respectively, of the single ended, tubular connector shown in FIG. 1A before insertion of a ball terminal into a mating end of the connector.

FIGS. 1D and 1E are top cross-sectional and elevation views, respectively, of the single ended, tubular connector shown in FIG. 1A during insertion of a ball terminal into the mating end of the connector.

FIGS. 1F and 1G are top sectional and elevation views, respectively, of the single ended, tubular connector shown in FIG. 1A where the ball terminal is retained in the mating end of the connector.

FIGS. 3A and 3B are simplified elevation and top sectional views, respectively, of one prong of a two prong tubular connector that is fabricated in accordance with one or more embodiments of the present invention as the prong contacts a spherical ball terminal along a locus of contact.

FIGS. 4A-4D are cross-sectional views of a socket for microelectronic devices that is fabricated in accordance with one or more embodiments of the present invention: wherein FIG. 4A is a socket comprising an array of single ended connectors that are fabricated in accordance with one or more embodiments of the present invention; FIG. 4B is an alternative socket arrangement that is fabricated in accordance with one or more embodiments of the present invention in which a dielectric support protects an array of connectors; FIG. 4C shows the socket illustrated in FIG. 4A after it is affixed to a substrate; and FIG. 4D shows the socket illustrated in FIG. 4A mated to a microelectronic device.

FIGS. 5A and 5B are cross-sectional views of a double-ended socket that is fabricated in accordance with one or more embodiments of the present invention comprising an array of tubular connectors that are fabricated in accordance with one or more embodiments of the present invention: wherein FIG. 5A shows the socket juxtaposed with a microelectronic device on a top side and a printed circuit board on a bottom side; and FIG. 5B shows the socket mated to the microelectronic device and to the printed circuit board, thereby interconnecting corresponding terminals.

FIGS. 6A and 6B are perspective and elevation views, respectively, a compact double-ended connector that is fabricated in accordance with one or more embodiments of the present invention.

FIGS. 6C and 6D are cross-sectional views, respectively, of a socket that is fabricated in accordance with one or more embodiments of the present invention comprising an array of compact double-ended connectors that are fabricated in accordance with one or more embodiments of the present invention: wherein FIG. 6C shows the socket and FIG. 6D shows the socket mated to a microelectronic device on one side and to a printed circuit board on an opposing side.

FIGS. 7A and 7B are perspective and elevation views, respectively, of a resilient double-ended connector that is fabricated in accordance with one or more embodiments of the present invention.

FIGS. 7C and 7D are cross-sectional views of a socket that is fabricated in accordance with one or more embodiments of the present invention comprising an array of resilient double-ended connectors that are fabricated in accordance with one or more embodiments of the present invention: wherein FIG. 7C shows the socket and FIG. 7D shows the socket mated to a microelectronic device on one side and to a printed circuit board on an opposing side.

DETAILED DESCRIPTION

Figure 2A:
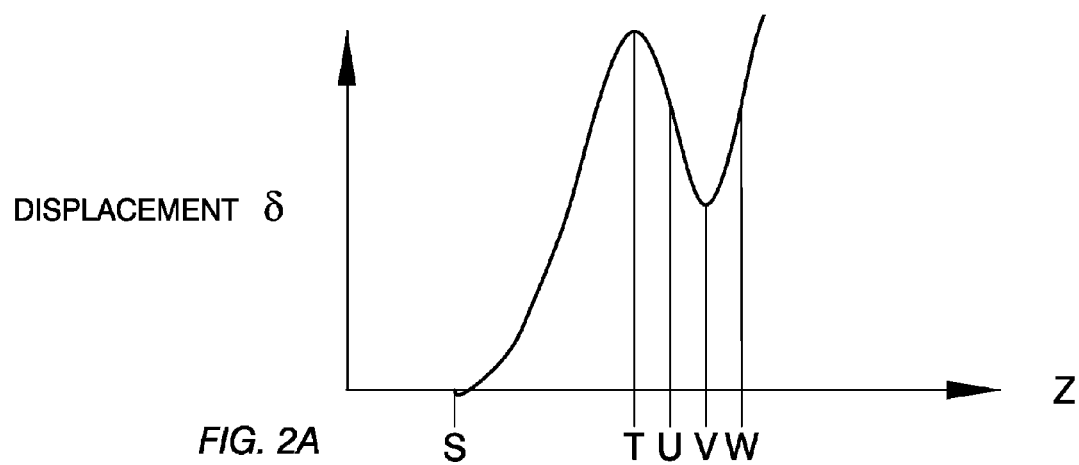
FIGS. 2A-2C illustrate variation of lateral prong displacement δ, prong spring energy ∈ and axial force F, respectively, as a function of distance Z (Z is measured from a mating end of a tubular connector that is fabricated in accordance with one or more embodiments of the present invention into the tubular connector) when a bulbous terminal is inserted a distance Z into the tubular connector.

In accordance with one or more embodiments of the preset invention, a connector is provided for making electrical connection to devices. In particular, one or more such embodiments, the connector is a connector for making electrical connection to microelectronic devices, and in further particular, to microelectronic devices with closely spaced terminals. In accordance with one or more embodiments of the present invention, a self-retaining connector comprises a cylindrical metal tube cut in a pattern of apertures and slots that perforate the wall (i.e., cut completely through the wall) to form several resilient prongs that are adapted to contact a bulbous terminal and to retain it in a detent formed by edges of the apertures. As used herein the term microelectronic device includes devices such as, for example and without limitation, integrated circuits ("ICs")—including, also without limitation, microprocessors, chips for peripheral functions and random access memories (RAM).

FIG. 1A is a perspective sectional view of single ended, tubular connector 100 having prongs 118 adapted to retaining a bulbous terminal having a maximum diameter slightly larger than an inner diameter of tubular connector 100, which connector 100 is fabricated in accordance with one or more embodiments of the present invention. As used herein, the term bulbous terminal refers to a ball or bump terminal or rounded projection or an "onion shaped" terminal or terminal ball having a maximum in its lateral extent, for example, its diameter.

As shown in FIG. 1A, tubular connector 100 comprises hollow metal tube 110 having a cylindrical wall which is cut through on top end 112 by four slots 116 thereby forming four resilient prongs 118. As used herein, the term slots means cuts that perforate (i.e., cuts made completely through) the wall of the tube; and the term prong refers to a branch or projection ("a slender pointed or projecting part: as a fang of a tooth") of a connector. For clarity of exposition, only one of each of the slots, prongs, apertures and tips is labeled in FIG. 1A. As used herein: (a) top means in a direction toward a top of a sheet holding a figure, and correspondingly, bottom means in a direction toward a bottom of the sheet; (b) the terms tube and tubular refer to a cylindrical body that is hollow along at least a portion adapted to make a connection (as will be described below) and has inner walls that are substantially parallel to an axis of the cylindrical body along the hollow portion(s)—a cross-section of hollow portions of the cylindrical body perpendicular to its axis may be circular, round, oval, oblate, rectangular, elongated, and so forth; and (c) the term resilient means elastic, spring like and not taking a permanent set. Thus, it should be understood that in accordance with one or more embodiments, the terms tube and tubular refer to a cylindrical body that is hollow throughout, and in accordance with one or more further embodiments, the cylindrical body is hollow along at least at one or more portions that are adapted to make a connection (as will be described below). In addition, it should be understood that in accordance with one or more embodiments, the cylindrical body has straight inner walls and/or straight outer walls along the whole or a portion of the body.

As further shown in FIG. 1A, four apertures 114 perforate (i.e., cut through) the wall of tube 110 are arrayed around the girth of tube 110 near top end 112. As used herein, the term aperture refers to a hole through the wall of the tubular connector. Apertures 114 of this embodiment are ovoid (as used herein, the term ovoid means generally egg shaped and includes within its scope, without limitation, rounded shapes, elliptical shapes, oblate shapes and the like), with slot 116 transecting or dividing each aperture 114 into two parts. As further shown in FIG. 1A, contours of slots 116 are rounded where the slots intersect top end 112 and where it transects apertures 114. As will be described below, prongs 118 are adapted to grip a bulbous terminal that is inserted into tubular connector 100 along an axis thereof.

In accordance with one or more embodiments of the present invention, tubular connector 100 is made from hypodermic tubing of Type 304 stainless steel having an inner diameter of 440 microns and an outer diameter of 550 microns—suitable tubing stock material is available from K-Tube Corporation of Poway, Calif. In accordance with one or more such embodiments, slots 116 are made through wall 112 of the tube by cutting along a length of the tube using, for example and without limitation, a Nd-YAG laser. Slots 116 may be cut to a width, for example and without limitation, of about 30 microns by the laser cutting process. In accordance with one or more such embodiments, apertures 114 are made using the same laser cutting process used to make slots 116. As will be further described below, the size and shape of apertures 114 are determined by factors including: a shape of bulbous terminal 130; a diameter of terminal 130; an inner diameter of metal tube 110; a thickness of tube 110; and the forces needed to retain terminal 130 in a detent position. In accordance with one or more embodiments of the present invention, aperture 114 is an ovoid hole 175 microns wide in a circumferential direction, i.e., around tube 110, and 125 microns long in an axial direction, i.e., along the axis of tube 110. Further, in accordance with one or more such embodiments, and as shown in FIG. 1A, slots 116 transect apertures 114 into two nearly equal parts. As will be further described below, the relationship of slot 116 to aperture 114 depends upon factors including an angle of slot 116 with respect to an axis of tube 110 (slope of the slot) so that, in accordance with one or more further embodiments of the present invention, apertures 114 may be divided into unequal parts by slots 116.

In accordance with one or more embodiments of the present invention, after laser cutting, the tube is plated with, for example and without limitation, a 2 micron thick layer of nickel and a 1.5 micron thick layer of hard gold to form a highly conductive surface for contacting a mating bulbous terminal. The inventor has discovered that a steel core enables prongs 118 to have sufficient resilience so that connector 100 is able to grip bulbous terminal 130 wherein the opening of mating end 112 of tube 110 is expanded from an initial internal diameter of 440 microns to accommodate bulbous terminal 130 having diameter 480 microns when it is inserted into tube 110 along its longitudinal axis. As used herein, a mating end of a connector refers to an end of the connector adapted to mate with a bulbous terminal.

As will be described below, tubular connector 100 shown in FIG. 1A connects electrically to metal bulbous terminal ball 130, and retains ball 130 in a mechanical detent formed by edges 122 of apertures 114 within tubular connector 100 at a detent position. As used herein, the term detent refers to a device for positioning and holding one mechanical part in relation to another so that the device can be released by force applied to one of the parts. Once terminal ball 130 is inserted and engaged in the mechanical detent, terminal ball 130 is retained in place by the detent so that, for example and without limitation, a force in a range from about 5 gf to about 30 gf is needed to move terminal ball 130 in either direction out of the detent. As such, one of ordinary skill in the art would understand that a socket formed of an array of contactors formed in accordance with one or more embodiments of the present invention, such as connector 100, will hold terminal balls 130 on a microelectronic device in position without the need of a clamp or other mechanical apparatus.

The self-retaining functionality of connector 100 will described in conjunction with FIGS. 1B to 1G which help illustrate a sequence of steps involved in inserting ball terminal 130 into mating end 112 of connector 110. FIGS. 1B and 1C are top cross-sectional and elevation views, respectively, of single ended, tubular connector 100 shown in FIG. 1A before insertion of ball terminal 130 into mating end 112 of connector 100. FIG. 1B is a cross-sectional view of connector 100 through a plane indicated by arrows B and B' in FIG. 1C, and FIG. 1B shows slots 116 cut through the wall of tube 110 which form resilient prongs 118. As shown in FIG. 1C, ball terminal 130 moves in the direction shown by arrow Z toward top end 112 of connector 100.

FIGS. 1D and 1E are top cross-sectional and elevation views, respectively, of single ended, tubular connector 100 shown in FIG. 1A during insertion of ball terminal 130 into mating end 112 of connector 100. FIG. 1D is a cross-sectional view of connector 100 through a plane indicated by arrows D and D' in FIG. 1E. As shown in FIGS. 1D and 1E, prongs 118 are urged radially away from a longitudinal axis of tube 110, which urging is caused by the action of inserting ball terminal 130 into tube 110 along the longitudinal axis. In particular, as further shown in FIGS. 1D and 1E, ball terminal 130 urges outwardly against edges of slots 116 indicated by "T" thereby moving prongs 118 outwardly as shown in cross-sectional view D-D' of FIG. 1D. In accordance with one or more such embodiments of the present invention, as ball terminal ball 130 is inserted further into connector 100, terminal 130 reaches a detent wherein it is captured in apertures 114.

FIGS. 1F and 1G are top sectional and elevation views, respectively, of single ended, tubular connector 100 shown in FIG. 1A where ball terminal 130 is retained in mating end 112 of connector 100. FIG. 1F is a cross-sectional view of connector 100 through a plane indicated by arrows F and F' in FIG. 1G. As shown in FIGS. 1F and 1G, ball terminal ball 130 is held in the detent of apertures 114 wherein edges 122 of apertures 114 contact a surface of ball terminal 130 at one or more of locations "U", "V" and "W" and hold it securely in place. In accordance with one or more such embodiments of the present invention, as ball terminal 130 is captured in the detent formed by edges 122 of aperture 114, prongs 118 relax inwardly to hold ball terminal 130 so that physical work must be done to expand prongs 118 outwardly to move ball terminal 130 from this detent position. In accordance with one or more such embodiments, if ball terminal 130 is moved or urged toward mating end 112, edge 122 urges against the surface of ball terminal 130 near location "U" to maintain the position of ball terminal 130 near the detent. Correspondingly, if ball terminal 130 is moved or urged further into tube 110, edge 122 urges against the surface of ball terminal 130 near location "W" to maintain the position of ball terminal 130 near the detent. In accordance with one or more such embodiments, at the detent position, the center of ball terminal 130 is at nearly the same distance from mating end 112 of connector 100 as is the center of apertures 114. In accordance with one or more such embodiments, a center of apertures 114 lie at a distance from mating end 112 that is in a range from about 0.25 times the radius of bulbous terminal 130 to about 2 times the radius of ball 130, depending upon details of bulbous terminal 130 and its method of mounting. Further, in accordance with one or more embodiments of the invention, a center of each aperture is located at a distance of less than an outer diameter of the tube from the mating end. Still further, in accordance with one or more embodiments of the present invention, two or more slots cut through the wall and extend from a mating end to a length greater than twice an outer diameter of the tube.

In accordance with one or more embodiments of the present invention, bulbous terminal 130 is retained and held by energy stored in resilient prongs 118 of tubular connector 100. The retention force is provided by edges of apertures 114 in the wall of cylindrical tube 112 acting upon ball terminal 130. This is different from prior art connectors where a retention force is provided by features such as tabs, cogs, bent springs and the like. In addition, and in accordance with one or more embodiments of the present invention, connector 100 does not rely solely upon frictional forces to retain terminal 130 in position. In particular, during insertion of bulbous terminal 130 into connector 100, prongs 118 are first urged by ball 130 outwardly, away from a central, longitudinal axis of tube 112. Then, as terminal 130 is progressively inserted further along the longitudinal axis of tube 112, there is a position at which prongs 118 start to, and continue to, relax inwardly toward the longitudinal axis of tube 112, thereby holding bulbous terminal 130 against edges 122 of aperture 114.

Figure 2B:
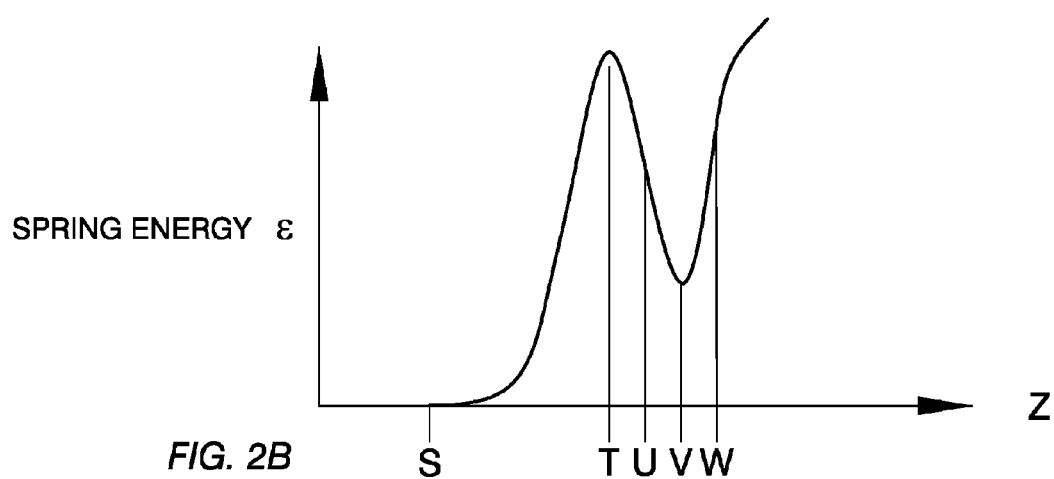
Figure 2C:
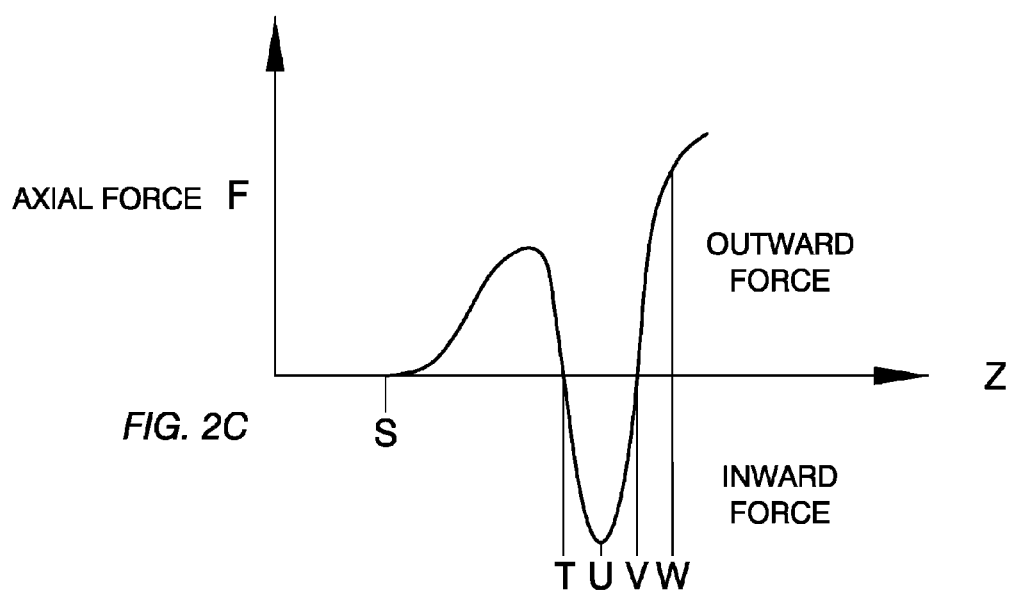

The manner in which connector 100 operates may be understood by reference to FIGS. 2A-2C. FIGS. 2A-2C illustrate the variation of lateral prong displacement δ, prong spring energy $\in$ and axial force F, respectively, as a function of distance Z (Z is measured from mating end 112 into tube 112) when ball terminal 130 is inserted into tube 112 of tubular connector 100. As shown in FIG. 2A, prongs 118 are displaced outwardly by a distance δ in a radial direction (i.e., a direction away from a central longitudinal axis of tube 112) as terminal 130 is inserted into connector 100. As indicated by FIG. 2B, the spring energy $\in$ stored in prongs 118 increases so that $\in$ is approximately proportional to the square of displacement δ. In particular, after terminal 130 first makes contact with connector 100 at Z=S, prongs 118 are urged apart outwardly until a maximum of displacement δ is reached at Z=T. Correspondingly, the energy $\in$ stored in prongs 118 also reaches a maximum at Z=T. Then, as terminal 130 is advanced further in the Z direction along the axis of tube 112, prongs 118 relax inwardly until the displacement δ and the corresponding stored energy $\in$ reach a minimum at detent position Z=V. A yet further advancement of terminal 130 in the Z direction along the axis of tube 112 causes an increase in displacement δ and an increase in stored energy $\in$—this is shown, for example, at position Z=W. Thus, terminal ball 130 is at "rest" in a detent at position Z=V where spring energy $\in$ is at a relative minimum.

The axial force F exerted upon ball terminal 130 is calculated from the spring energy $\in$ according to the relationship F=∂$\in$/∂Z, which relationship states that the axial force F acting on ball terminal 130 is equal to the rate of change of spring energy with respect to position Z of terminal ball 130 along the axis of tube 112. At position Z=V where spring energy $\in$ is a minimum, the axial force F acting on ball terminal 130 is zero because the rate of change in energy $\in$ with respect to Z, or the slope of the curve of $\in$ vs. Z, is zero. As ball terminal 130 is moved outwardly (i.e., Z is decreased) from Z=V to Z=U, the slope of the curve of $\in$ vs. Z is negative, and as a result, correspondingly, the force F acting upon ball terminal 130 is negative. As such, force F urges ball terminal 130 inwardly, i.e., back to the detent position at Z=V. On the other hand, as ball terminal 130 is moved inwardly (i.e., Z is increased) from Z=V to Z=W, the slope of the curve of $\in$ vs. Z is positive, and as a result, correspondingly, the force F acting upon ball terminal 130 is positive. As such, force F urges ball terminal 130 outwardly, i.e., back to the detent position at Z=V. Hence, this illustrates how energy stored in prongs 118 acts upon a ball terminal to retain the ball terminal at a detent position. Advantageously, this occurs without a need for frictional forces to retain the ball terminal in the connector.

In accordance with one or more embodiments of the present invention, the force F acting upon ball terminal 130 to retain it at an operating position depends upon factors that include a shape of aperture 114. As used herein, the term operating position means a position substantially at detent position Z=V, referring to FIG. 2A, and, as used herein, substantially at Z=V means at a position in a range between Z=U and Z=W where the forces generated are sufficient to retain the terminal in the range during a particular application. In particular, if aperture 114 is shaped so that positions U and W are moved further apart, the restoring force F is reduced, and the range of the operating position (or capture range) is broadened.

In accordance with one or more embodiments of the present invention, to increase a restoring force and to retain a ball terminal tightly at an operating position, aperture 114 is shaped so that edges 122 of aperture 114 make contact with the ball terminal at several values of Z, for example and without limitation, at Z=U, Z=V and Z=W, simultaneously. A generally ovoid aperture 114 is useful for retaining a spherical ball terminal at an operating position in connector 100. Although aperture shapes useful for retaining bulbous terminals of other shapes may vary, the principles explained herein will enable one of ordinary skill in the art to design aperture shapes that are useful for suitable retention of such terminals in particular applications routinely and without undue experimentation.

Design of an aperture for tightly retaining a spherical ball terminal in a connector that is fabricated in accordance with one or more embodiments of the present invention is described for a two prong connector in conjunction with FIGS. 3A and 3B. FIGS. 3A and 3B are simplified elevation and top sectional views, respectively, of one prong (prong 218) of a two prong tubular connector (that is fabricated in accordance with one or more embodiments of the present invention) as prong 218 contacts spherical ball terminal 230 along a locus of contact. As shown in FIG. 3B, at an operating position, edge 222 of interior surface 220 of prong 218 intersects the surface of spherical ball terminal 230 along a locus of points which lie along curve 226 shown in a projection onto the Y-Z plane in the elevation view of FIG. 3A. For clarity of exposition, only the interior cylindrical surface of prong 118 is shown in FIG. 3A. The top cross-sectional view of FIG. 3B shows contact between edge 222 of prong 218 and spherical ball terminal 230. In accordance with one or more embodiments of the present invention, interior surface 220 of prong 218 has a radius r that is a less than a radius R of ball terminal 230. Because r<R, interior surface 220 of prong 218 touches ball terminal 230 only at edges 222 of aperture 214, and interior surface 220 of prong 218 does not touch ball terminal 230 on cylindrical portions of interior surface 220. As shown in FIG. 3A, curve 226 is approximately parabolic near the origin at Z=0, wherein Y=$Z^2$/(2a)+K and where a=(R−r) and K is a constant. Because edge 222 of aperture 214 comes into contact with the surface of ball terminal ball 230 for some distance along curve 226, ball terminal 230 is held tightly in position at the detent along the Z axis as described above.

Edge 222 shown in FIG. 3A forms a portion of an edge of aperture 214—the other portion of the edge of aperture 214 is associated with an adjacent prong (not shown). The spacing or slot between prongs transects aperture 214 into two portions, one portion of which is shown as aperture 214 in FIG. 3A. In accordance with one or more embodiments of the present invention, apertures for a connector are ovoid, and the ovoid apertures are transected by slots between prongs of the connector. In addition, in accordance with one or more such embodiments, a slot transects or divides an aperture into two portions, which portions may be equal or unequal portions, depending upon the design and the slope of the slot. The intersection between the slot and the aperture may be rounded to facilitate fabrication and use of the connector.

Thus, as has been described above, in accordance with one or more embodiments of the present invention, a bulbous terminal, for example a spherical metal ball of a BGA, may be held by a tubular connector. In accordance with one or more such embodiments, the tubular connector comprises a metal tube having two or more apertures cut through a wall of the tube in a circumferential array disposed near a mating end of the tube. In particular, each aperture is transected by a slot cut through the wall of the tube, wherein each slot starts at the mating end of the tube, and extends along a length of the tube away from the mating end. The slots divide the mating end of the tube into resilient prongs that are able to deflect radially away from the tube axis to enable the bulbous terminal to be captured within the tube by mechanically gripping the bulb as the bulb is inserted along the longitudinal axis of the tube. In accordance with one or more such embodiments, the bulb is held by edges of the apertures as the resilient prongs urge inwardly, thereby retaining the bulb in a detent at the point along the axis of the tube where the maximum diameter of the bulb aligns with the array of apertures. In accordance with one or more such embodiments, the bulbous terminal is retained in the detent so that force is needed to move the terminal substantially either inward or outward along the axis of the tubular connector. In accordance with one or more such embodiments, the shape of the aperture useful to provide a detent may be ovoid or egg shaped. Advantageously, in accordance with one or more embodiments of the present invention, connector holds the terminal in place at a detent formed in a straight walled tube without the need for protrusions, catches, bent tabs, spring levers and so forth.

In accordance with one or more such embodiments, connectors may be utilized to provide a socket for retaining mechanically a microelectronic device with a dense array of bumps such as, for example and without limitation, solder balls, wherein the connectors have a lateral extent that is only slightly larger than that of the bumps. For example, a connector made by laser cutting a thin wall, stainless steel, tube can be made with an outside diameter of only 30 microns, thereby allowing spacing between connectors to be small in order to form a high density array of connectors.

Figure 4A:
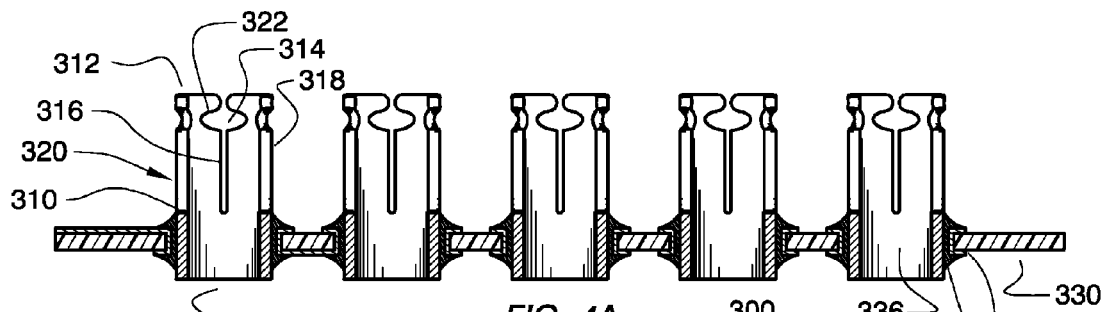
Figure 4B:
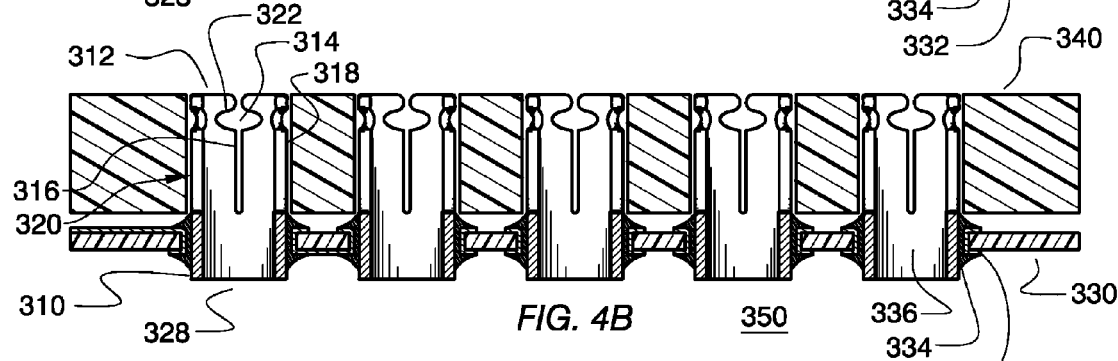

FIGS. 4A-4B are cross-sectional views of socket 300 and socket 350, respectively, that are fabricated in accordance with one or more embodiments of the present invention. As shown in FIG. 4A, socket 300 is a socket for microelectronic devices that comprises an array of single ended, tubular connectors 320 that are fabricated in accordance with one or more embodiments of the present invention. As further shown in FIG. 4A, tubular connectors 320 are held in holes 336 through carrier sheet 330 (i.e., carrier sheet 330 provide a holder for connectors 320). In accordance with one or more such embodiments, each connector 320 comprises stainless steel tube 310 having apertures 314 disposed in an array around the girth of tube 310 near mating end 312 of tube 310. As further shown in FIG. 4A, and in accordance with one or more such embodiments, slots 316 cut through a wall of tube 310 transect each aperture 314 to form resilient prongs 318 in mating end 312 of connector 320. In accordance with one or more such embodiments, tube 310 is plated with 2 microns of nickel and about 1.5 microns of hard gold, using any one of a number of methods that are well known to those of ordinary skill in the art. In accordance with one or more such embodiments, connectors 320 are held in holes 336 in carrier sheet 330 using any one of a number of methods that are well known to those of ordinary skill in the art using well known attachment means and processes including, for example and without limitation, solder, lead free solder, a polymeric adhesive, laser welding, a polymer collar, and the like. In accordance with one such embodiments, the attachment process entails reflow of $Ag_{3.5}Sn$ solder (solder 334 in FIG. 4A) to tubes 320 and to copper traces 332 on printed circuit carrier sheet 330.

As shown in FIG. 4B, socket 350 is a socket for microelectronic devices that comprises an array of single ended, tubular connectors 320 that are fabricated in accordance with one or more embodiments of the present invention. As further shown in FIG. 4B, dielectric form 340 used to maintain alignment of connectors 320. In particular, dielectric form 340 may be used temporarily in maintaining alignment of connectors 320 during the process of assembly of the socket to a circuit board or other circuit element. Alternatively, dielectric form 340 may be a permanent part of socket 350 wherein it aligns and protects connectors 320 during operation. When used as a permanent part of socket 350, dielectric form 340 may comprise a dielectric material selected from a group of polymers including, for example and without limitation, silicone rubber, FR-4 epoxy, a thermoplastic polymer, a fluorosilicone elastomer, Ultem 2000 available from GE Company GE Plastics of Pittsfield Mass., PEEK, polysufone, nylon, a heat releasable polymer film, and a liquid crystal polymer.

Figure 4C:
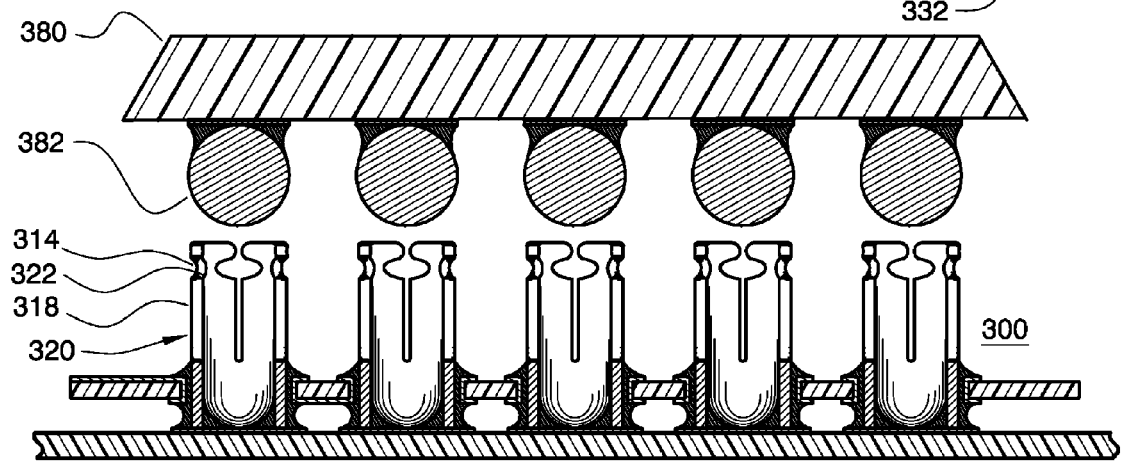
Figure 4D:
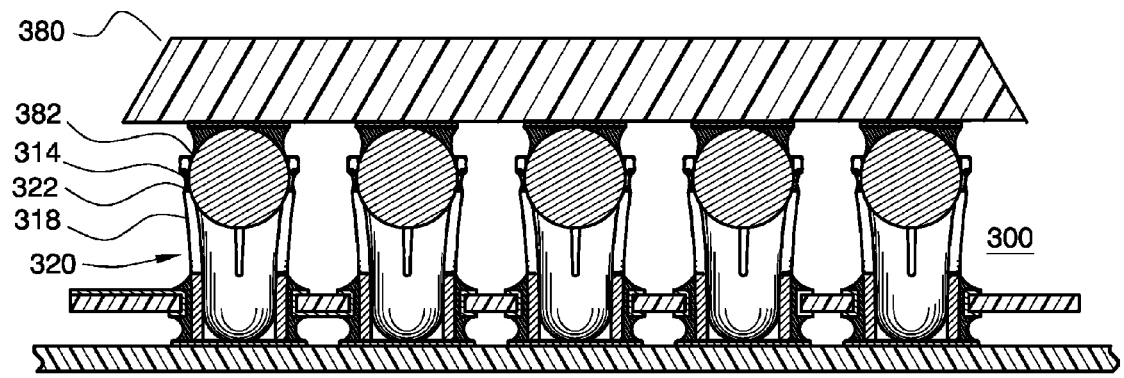

In accordance with one or more embodiments of the present invention, socket 300 (or socket 350) may be attached to a printed circuit board by a standard surface mount solder reflow process that is well known to those of ordinary skill in the art wherein connectors 320 are joined to pads 362 on the surface of the board as shown in FIG. 4C. In accordance with one or more embodiments, dielectric form 340 may be used temporarily to align and protect connectors 320 during the solder reflow process, and then removed thereafter.

FIG. 4C shows socket 300 (after it is affixed to a substrate (a support for the socket body that holds the connectors, for example and without limitation, a printed circuit board) juxtaposed to microelectronic device 380. In accordance with one or more embodiments of the present invention, microelectronic device 380 is inserted into socket 300 by urging it toward socket 300, thereby engaging each BGA terminal 382 with a corresponding one of connectors 320. As a result, prongs 318 of connectors 320 are urged radially outward by terminal 382s. Advantageously, after engagement of microelectronic device 380 in socket 300, microelectronic device 380 is self-retained in position by socket 300 without benefit of a clamp, cam closure device or the like. In particular, each BGA terminal 382 is retained in a corresponding one of connectors 320 by contact with edges 322 of apertures 314 in prongs 318 in the manner described above. Microelectronic device 380 may be extracted from socket 300 by urging the device away from the socket. Extraction may be facilitated by vibrating device 380 relative to socket 300. Facilitating vibration includes utilizing sonification, ultrasonic agitation, circularly polarized vibration, and the like.

Figure 5A:
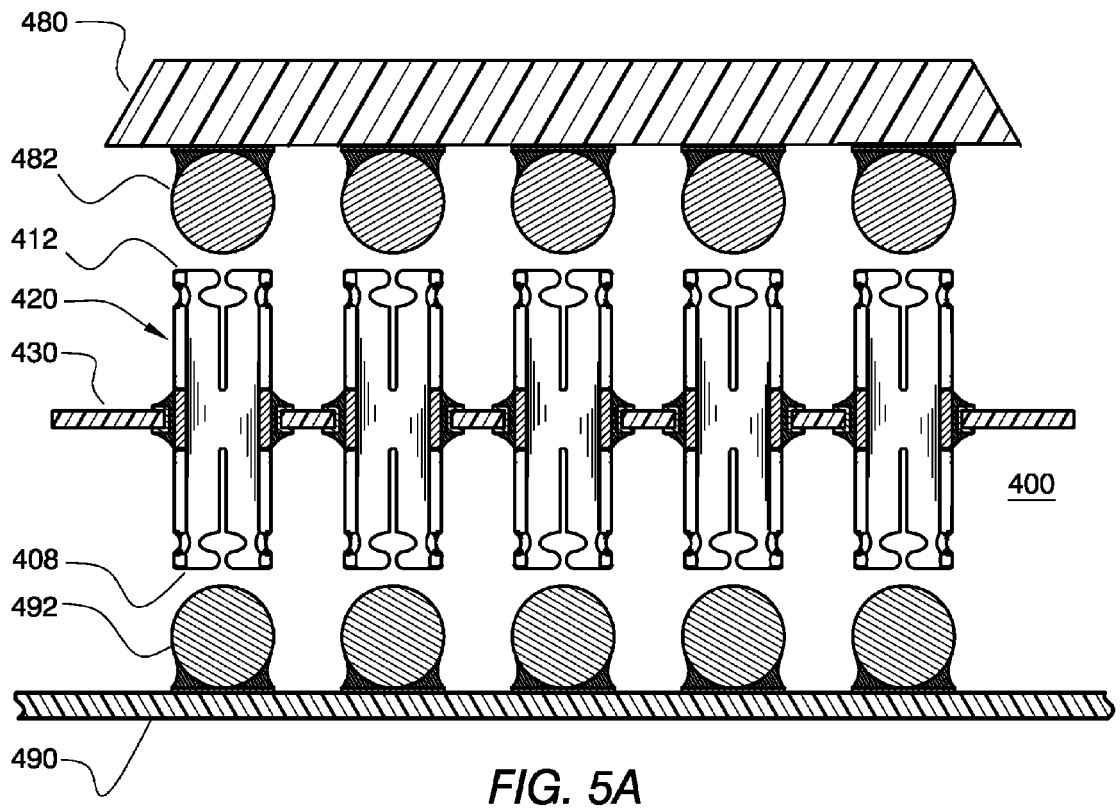

FIG. 5A is cross-sectional view of double-sided socket 400 that is fabricated in accordance with one or more embodiments of the present invention. Double-sided socket 400 provides electrical interconnection between corresponding terminals on first and second microelectronic devices, and FIG. 5A shows double-sided socket 400 juxtaposed with microelectronic device 480 on a top side and printed circuit board 490 on a bottom side.

As shown in FIG. 5A, double-sided socket 400 comprises a plurality of double-ended connectors 420 that are supported in insulative carrier sheet 430. As used herein, the term double-ended describes connector with two mating ends. In accordance with one or more embodiments of the present invention, double-ended connectors 420 have equivalent top 412 and bottom 408 ends. As used herein, equivalent means substantially mechanically equivalent with substantially equal insertion forces. In accordance with one or more such embodiments, the top half of connector 420 shown in FIG. 5A is functionally equivalent to connector 100 of FIG. 1A so that the same principles of operation described above apply. For clarity of exposition, labels are omitted from elements of the connector 420 in the FIGS. 5A and 5B since one of ordinary skill in the art would be able to identify features of the top half of connector 420 and of the bottom half of connector 420 in correspondence with equivalent features of connector 100 of FIG. 1A.

Figure 5B:
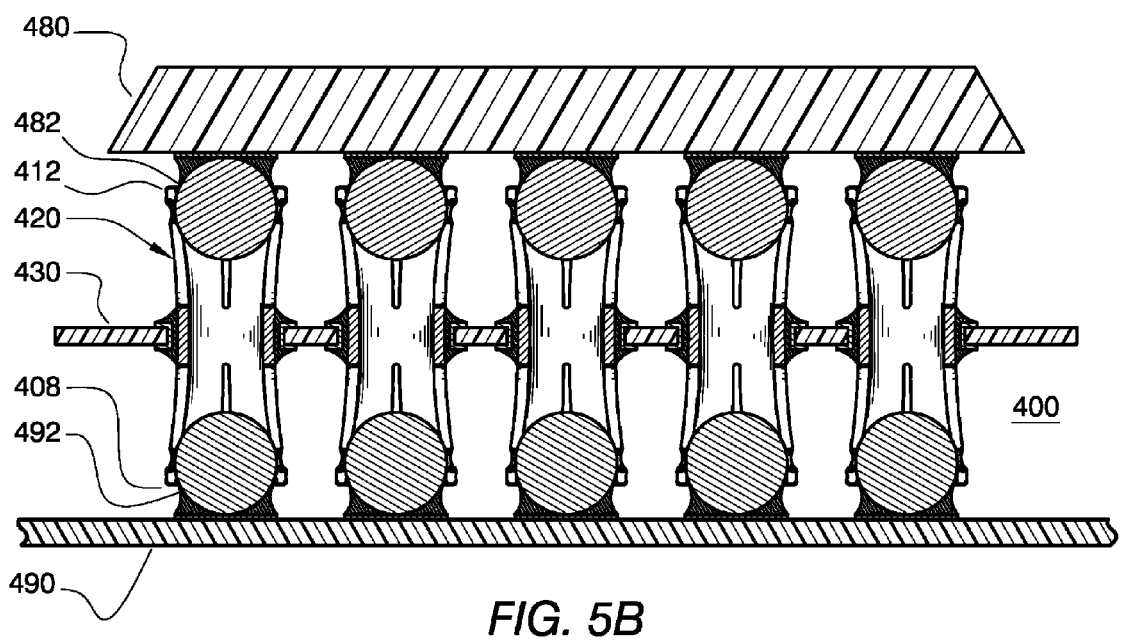

FIG. 5B shows socket 400 mated to microelectronic device 480 and to printed circuit board 490, thereby interconnecting corresponding terminals. In accordance with one or more embodiments of the present invention, an electrical and mechanical connection between microelectronic BGA device 480 and printed circuit board device 490 is made when BGA device 480 is urged toward printed circuit board device 490 wherein double-sided socket 400 is interposed therebetween. In mating both devices 480 and 490 with socket 400, terminals 482 of device 480 are inserted into top end 412 of connectors 420, and terminals 492 of device 490 are inserted into bottom end 408 of connectors 420. Any sequence of insertion may be used to effectuate coupling of first device 480 with second device 490, thereby forming an electrical and mechanical link therebetween as shown in FIG. 5B. Both devices 480 and 490 are held and retained, one to another, through the agency of socket 400 interposed therebetween. Each of BGA terminals 482 on device 480 is retained against further insertion or extraction movement by a detent near the top end 412 of a mating connector 420. Similarly, each of metal ball terminals 492 on circuit board device 490 is retained against further insertion or extraction movement by a detent near the bottom end 408 of a mating connector 420. Thus, device 480 is held securely against decoupling from the mating circuit board device 490 that may be caused by the action of vibration, gravitational forces, mechanical shock and the like. Advantageously, socket 400 is self-retaining, and couples device 480 to device 490 without the need for mechanical clamping means.

In accordance with one or more embodiments of the present invention, another form of bulbous terminal may be used in place of metal ball terminals 492, provided that such other form of bulbous terminal has a shape with a maximum in its diameter as measured in a plane perpendicular to an axis of the respective tube end. Bulbous terminals for suitable for such use include, for example and without limitation, solder bumps, metal spheres, plated metal bumps, Swiss machined terminal posts, hollow metal bosses, and the like—all of which are designed to have a shape with a maximum in their diameter, thereby allowing them to be captured in a detent in the connector.

Advantageously, in accordance with one or more embodiments of the present invention, the assembly shown in FIG. 5B which comprises BGA device 480, circuit board device 490, and interposed socket 400, provides additional benefits of reliability and shock resistance. In particular, flexure of tubular connectors 420 allows a measure of resilient motion of BGA terminals 482 with respect to metal ball terminals 492 where the motion is in the plane of the terminals. In addition, and in accordance with one or more embodiments of the present invention, flexure of tubular connectors 420 is further increased by fabricating carrier sheet 430 of a flexible mate-rial (for example and without limitation, a thin, flexible polyimide film) that allows the axis of each connector 420 to tip out of perpendicularity with respect to a plane holding the terminals. In further addition, and in accordance with one or more embodiments of the present invention, flexure of connectors 420 is further increased in a direction along the axis of the connector by cutting slots 416 at an angle to the axis. For example and without limitations, slots made in a curvilinear pattern, i.e., a helical or spiral pattern (such as, for example and without limitation, the helical pattern of connector 600 shown in FIG. 7A), allow spring-like stretching of the connector, thereby providing axial resilience. Advantageously, the additional in-plane and axial resilience provided by connectors fabricated in accordance with one or more embodiments of the present invention enhance reliability by allowing relative movement of devices without disturbing electrical connections therebetween.

Thus, as has been described above, in accordance with one or more embodiments of the present invention, a double-ended connector is provided to enable a first bulbous terminal to be connected mechanically and electrically to a second bulbous terminal so as to retain the two terminals in position relative to each other. One or more of such embodiments enable use of an array of such double-ended connectors to attach a microelectronic device to a substrate without need for a mechanical retaining component to apply force urging the device toward the substrate. As was also described above, one advantage provided by one of more embodiments of the present invention which comprise a tubular connector with shaped prongs on a first end that engage a first ball and shaped prongs on a second end that engage a second ball is that the first ball is relatively free to move with respect to the second ball in a plane perpendicular to the axis of the tubular connector. Such motion offers an advantage by relieving mechanical stress due to thermal expansion mismatch, shock, vibration, and other mechanical motion. As was also described above, another advantage provided by one or more embodiments of the present invention which comprise a tubular connector wherein the two or more slots through the wall of the tube are generally helical in order to form helical prongs which provide additional axial and lateral mechanical resilience to the connector. Thus, while a bulbous terminal is gripped by edges of the apertures, the terminal may move resiliently by flexing the helical prongs without loosening the grip holding the bulb in a detent.

One or more embodiments of the invention provide a high performance connector for clasping a first bulbous terminal to a second bulbous terminal wherein the distance between the first and second terminals is short. FIG. 6A is a perspective view of compact double-ended tubular connector 500 that is fabricated in accordance with one or more embodiments of the present invention, and is adapted to interconnect, mechanically and electrically, a pair of bulbous terminals wherein the spacing between the terminals is fixed. FIG. 6B shows an elevation view of connector 500 with first bulbous terminal 582 mated at first end 512 and second bulbous terminal 592 mated at a second end 508 (terminals 582 and 592 are shown in phantom in FIG. 6B). As shown in FIG. 6B, tubular connector 500 engages and holds first and second terminals 582 and 592 in a position where the distance between the terminals is small. In accordance with one or more such embodiments suitable for high performance, the mated terminals may touch, thereby providing a minimum spacing therebetween.

A preferred embodiment of connector 500 comprises cylinder 510 that is less than about one mm in diameter, and typically about 0.5 mm in diameter. In accordance with one or more such embodiments, cylinder 510 has a wall with a thickness from about 0.005 to 0.05 mm and with multiple slots 516, typically eight (but possibly more or less), in sets of four at each end, that are offset circumferentially and that extend from opposite ends 508 and 512 longitudinally along cylinder 510 so connector 500 can expand between slots 516. In accordance with one or more embodiments of the present invention, each slot 516 has a cutout or aperture 514 near, but not at, respective ends 508 and 512. The cutouts or apertures form a detent on slot 516 so that the detent can capture and retain ball 582 or 592 when the ball is inserted into mating ends 512 and 508, respectively.

In operation, balls 582 and 592 are inserted into mating ends 512 and 508, respectively, thereby causing prongs 518 in the walls of tube 510 to expand until each of balls 582 and 592 encounters a detent formed by the arrays of cutouts or apertures 514 arrayed near ends 512 and 508. Each ball 582 and 592 then rests in the detent. Inside ridges and edges 522 of each of cutouts or apertures 514 may be sharp, and therefore, they may engage balls 582 and 592—possibly gouging the balls to decrease electrical resistance, and enhance conductivity in the event of surface contamination or corrosion.

The inherent resilience of the walls of conductive cylinder 510, formed for example and without limitation of a metal or an alloy of metals, produces sufficient inwardly directed force to retain ball 582 securely in cylinder 510 until such time as a counteracting withdrawal force releases ball 582. The flexibility of the walls is enhanced by the nature of the overlap of the slots cut from opposing ends 508 and 512. This force is most likely effected through a mechanical connection with ball 592.

Double-ended connector 500 provides flexibility of motion between mated pairs of terminals wherein the connector pivots on the terminal mated at each of ends 508 and 512. Flexibility of the connector may be further enhanced by extending the length of the slots in a curvilinear manner as illustrated in connector 600 of FIG. 7A. Slots 516 may be helical or otherwise curved to facilitate axial flexibility that is adapted to absorb mechanical motion due to vibration, thermal expansion, mechanical shock and the like. Additional resilience is provided in one or more preferred embodiments of the terminal wherein slots 516 from first end 508 overlap slots 516 from opposing end 512 wherein the length of a slot from first end 508 plus the length of a slot from second end 512 is greater than the length of tube 510, the respective lengths being measured in a direction along the axis of the tube.

Double-ended connector 500 may be incorporated into socket 550, an embodiment of which is shown in the cross-sectional view of FIG. 6C. As shown in FIG. 6C, connectors 500 are disposed in an array in carrier sheet 530 such that both ends of connectors 500 are exposed for mating. Labels of features of the connectors are omitted from FIGS. 6C and 6D for clarity of exposition. Carrier sheet 530 is preferably compliant to allow connectors 500 to expand radially when mating. In accordance with one or more embodiments of the present invention, carrier sheet 530 includes an insulative material such as, for example and without limitation: a silicon rubber with an embedded structural matrix; an elastomeric layer sandwiched between a top and a bottom carrier sheet; a multi-layer dielectric structure; and the like. Socket 550 may be used to couple two microelectronic devices into assembly 570 as shown in FIG. 6D wherein balls 582 on BGA device 580 are coupled to corresponding ones of metal ball terminals 592 on printed circuit board 590. Advantageously, BGA device 580 is mechanically held by socket 550 in registration to printed circuit board 590 without benefit of mechanical clamps. As one of ordinary skill in the art will understand, socket 550 may include guides, latches, dust covers, adhesives, alignment fixtures, and other features that facilitate practical use of the socket.

One or more alternative embodiments of the present invention provide a mechanically resilient connector for clasping a first bulbous terminal to a second bulbous terminal wherein the distance between the first and second terminals is a minimum. FIG. 7A is a perspective view of a resilient double-ended tubular connector 600 that is fabricated in accordance with one or more embodiments of the present invention, and is adapted to interconnect, mechanically and electrically, a pair of bulbous terminals. Tubular connector 600 provides a benefit of allowing two corresponding terminals 682 and 692 to be held in intimate electrical contact by axially resilient prongs or prongs 618 formed by helical slots 616 through the wall of tube 610. FIG. 7B illustrates a configuration wherein terminals 682 and 692 are held in contact. The position of terminals 682 and 692 is shown in phantom in FIG. 7B, where the spacing between the terminals is a minimum, i.e., the terminals are touching. Other configurations of connector 600 may be used to provide a greater spacing between the terminals as determined by a particular application.

One or more embodiments of the present invention illustrated in FIGS. 7A and 7B is ball grid array connector 600 for an electrical connection. Connector 600 comprises cylinder 610 that is less than about one mm in diameter, and typically about 0.5 mm in diameter. In accordance with one or more such embodiments, cylinder 610 has a wall with a thickness from about 0.005 to 0.05 mm. In addition, and in accordance with one or more such embodiments, cylinder 610 has multiple slots 616, typically eight (but possibly more or less), with four extending from a first end 612 helically along the cylinder 610 and four extending from a second end 608 helically along the cylinder 610—thereby forming prongs 618 in the cylinder wall that can expand between the interstitially disposed slots 616, and compress and expand resiliently along the longitudinal axis of the cylinder 610 to enable connector 600, when disposed in an array, to accommodate variances in length more easily.

In accordance with one or more embodiments of the present invention, each slot 616 has cutout 614 near but not at ends 612 or 608. In pairs, cutouts 614 form a detent across slot 616 so that the detent can capture and retain a ball (such as ball 682 or 692). Each of balls 682 and 692 has a diameter that is larger than an inner diameter of cylinder 610 when the ball (such as ball 682 or 692) is inserted into a mating end (such as mating end 612 or 608, respectively). The pair of cutouts forms an aperture that is transected or cut through by a slot to form two portions of a detent adapted to capture a bulbous terminal.

In operation, a ball (such as ball 682 or 692) is inserted into a mating end (such as mating end 612 or 608, respectively), thereby causing prongs in the walls of cylinder 610 to expand until the ball (such as ball 682 or 692) encounters a detent formed by cutout pairs 614, for example. When placed under pressure along its axis, cylinder 610 also compresses like a coil spring, and the ball (such as ball 682 or 692) then rests in the detent. Inside ridges and edges 622 of each of the pair of cutouts 614 may be sharp, and therefore, they may engage the ball (such as ball 682 or 692)—possibly gauging the ball (such as ball 682 or 692) to decrease electrical resistance, and enhance electrical conductivity in the event of surface contamination or corrosion.

The inherent resilience of the walls of conductive cylinder 610, formed for example and without limitation of a metal or an alloy of metals, produces sufficiently inwardly directed force to retain a ball (such as ball 682 or 692) securely in cylinder 610 until such time as a counteracting withdrawal force releases the ball (such as ball 682 or 692). When a withdrawal force is applied to the ball (such as ball 682 or 692), the helical slots allow cylinder 610 to extend, causing the detent to apply greater retention force against the ball (such as ball 682 or 692). This force is most likely effected through a mechanical connection with the ball (such as ball 682 or 692) that is not shown. When the withdrawal force is sufficient, the detent and associated helical slots release the ball (such as ball 682 or 692).

Double-ended resilient connector 600 may be incorporated into a socket, an embodiment of which is shown in the cross-sectional view of FIG. 7C. As shown in FIG. 7C, connectors 600 are disposed in an array in carrier 630 such that both ends of connectors 600 are exposed for mating. Labels of features of the connectors are omitted from FIGS. 7C and 7D for clarity of exposition. In accordance with one or more embodiments of the present invention, carrier sheet 630 is preferably compliant to allow connectors 600 to expand radially when mating. In accordance with one or more embodiments of the present invention, carrier sheet 630 includes an insulative material such as, for example and without limitation: a silicon rubber with an embedded structural matrix; an elastomeric layer sandwiched between a top and a bottom carrier sheet; a multi-layer dielectric structure; and the like. A slideable layer (not shown) may be incorporated into carrier sheet 630 to allow terminals 682 and 692 to be clamped more securely in connectors 600 by moving the slideable layer laterally by means of a cam to exert a compressive pressure on the outside walls of each connector 600.

Socket 650 may be used to couple two microelectronic devices to form an electronic assembly 670 as shown in FIG. 7D wherein balls 682 on BGA device 680 are coupled to corresponding ones of metal ball terminals 692 on printed circuit board 690. Advantageously, BGA device 680 is mechanically held by socket 650 in registration to printed circuit board 690 without benefit of mechanical clamps. As one of ordinary skill in the art will understand, socket 650 may include guides, latches, dust covers, adhesives, alignment fixtures, and other features that facilitate practical use of the socket.

Although embodiments of double-ended connectors have been described as having equivalent top and bottom ends, it should be appreciated that further embodiments exist for use in applications wherein top and bottom ends of double-ended connectors need not be equivalent. In particular, such non-equivalence can relate, among other things to mechanical non-equivalence and structural non-equivalence that may be useful in connecting terminals having different physical characteristics.

Embodiments of the present invention described above are exemplary. As such, many changes and modifications may be made to the description set forth above by those of ordinary skill in the art while remaining within the scope of the invention. In addition, materials, methods, and mechanisms suitable for fabricating embodiments of the present invention have been described above by providing specific, non-limiting examples and/or by relying on the knowledge of one of ordinary skill in the art. Materials, methods, and mechanisms suitable for fabricating various embodiments or portions of various embodiments of the present invention described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A connector for making electrical connection to a bulbous terminal, the connector comprising:
   a metal tube with a cylindrical wall extending from a mating end, wherein:
   an inner surface of the cylindrical wall is parallel to an axis of the metal tube;
   two or more slots perforate the wall and extend from the mating end along the tube;
   two or more apertures perforate the wall and are disposed in a circumferential array disposed a distance from the mating end; and
   each of the two or more slots transects one of the two or more apertures into two segments to divide the mating end of the tube into resilient prongs wherein the segments are disposed in adjacent resilient prongs.

2. The connector of claim 1 wherein the tube is hollow from the mating end to another end.

3. The connector of claim 2 wherein:
   the two or more apertures are ovoid in shape.

4. The connector of claim 3 wherein:
   the two or more slots extend from the mating end to a length greater than twice an outer diameter of the tube.

5. The connector of claim 2 wherein the two or more slots are straight.

6. The connector of claim 3 wherein a center of each aperture is located at a distance of less than an outer diameter of the tube from the mating end.

7. An electrical assembly of a connector mated to a bulbous terminal, the assembly comprising:
   a bulbous terminal having a maximum diameter;
   a metal tube with a cylindrical wall extending from a mating end, and having an inner diameter, wherein:
   an inner surface of the cylindrical wall is parallel to an axis of the metal tube;
   the maximum diameter of the bulbous terminal is greater than the inner diameter of the tube;
   two or more slots perforate the wall and extend from the mating end along the tube;
   two or more apertures perforate the wall and are disposed in a circumferential array disposed a distance from the mating end;
   each of the two or more slots transects one of the two or more apertures into two segments to divide the mating end of the tube into resilient prongs wherein the segments are disposed in adjacent resilient prongs; and
   the bulbous terminal is disposed at least partially in the tube in contact with edges of the segments.

8. The assembly of claim 7 wherein one or more edges of the two or more apertures contact a surface of the bulbous terminal.

9. The assembly of claim 8 wherein:
   the bulbous terminal is a ball of a ball grid array and the two or more apertures are ovoid in shape.

* * * * *